United States Patent [19]

Harrington, III

[11] Patent Number: 4,862,310
[45] Date of Patent: Aug. 29, 1989

[54] LOW LEAKAGE BATTERY PROTECTION DIODE STRUCTURE

[75] Inventor: Thomas E. Harrington, III, Carrollton, Tex.

[73] Assignee: Dallas Semiconductor Corporation, Dallas, Tex.

[21] Appl. No.: 187,864

[22] Filed: Apr. 29, 1988

[51] Int. Cl.⁴ .............................................. H02J 9/02
[52] U.S. Cl. .................................... 361/58; 365/229; 357/41; 357/48; 307/66; 429/121
[58] Field of Search ............................ 361/58, 86, 88; 357/23.1, 40–44, 48; 307/150, 66; 320/51, 53; 365/229; 29/576 R

[56] References Cited

U.S. PATENT DOCUMENTS

| | | | |
|---|---|---|---|
| 4,239,558 | 12/1980 | Morishita et al. | 148/175 |
| 4,642,667 | 2/1987 | Magee | 357/35 |
| 4,658,352 | 4/1987 | Nagasawa | 364/200 |
| 4,713,555 | 12/1987 | Lee | 307/66 |
| 4,730,121 | 3/1988 | Lee et al. | 307/66 |

OTHER PUBLICATIONS

Sedra, Adel S. and Kenneth C. Smith, *Microelectronic Circuits*, 1982, p. 358.

Primary Examiner—A. D. Pellinen
Assistant Examiner—David Osborn
Attorney, Agent, or Firm—Worsham, Forsythe, Sampels & Wooldridge

[57] ABSTRACT

A battery protection device for preventing battery charging comprises a diode formed with a p+ region (36) within an N-type region (34). The diode is completely surrounded by a P-well (32) to prevent minority carrier injection from the N-type region (34) to the N-type substrate (30). The N-type region (34) is connected to the P-well (32) and to the substrate (30) through an electrical connection (43). By preventing minority carrier injection into the substrate (30), leakage through a parasitic transistor is prevented.

32 Claims, 3 Drawing Sheets

LOW LEAKAGE BATTERY PROTECTION DIODE STRUCTURE

TECHNICAL FIELD OF THE INVENTION

The present invention pertains in general to battery protection devices, and more particularly to an integrated battery protection device in a semiconductor substrate for preventing battery leakage due to parasitic PNP transistors.

BACKGROUND OF THE INVENTION

Integrated circuits have generally seen an increase in use of on-board memory. Typically, the first on-board memories were in the form of Read Only Memories (ROMs) which did not require any power to obtain the information therein, but the information could not be altered by the user. As the need for more versatility in integrated circuits has increased, the requirement for erasing, or writing over, the stored information has become a necessity. Initially, erasable memory was realized in the form of Erasable Programmable Read Only Memories (EPROMs), which were typically erased by utilizing ultraviolet light, and Electrically Erasable Programmable Read Only Memories (EEPROMs), which are electrically erasable. These memories have the advantage that they require no power to maintain data integrity. However, these types of memories require special programming steps in order to erase and write new information to the memories. As a result, battery back-up systems have been incorporated with low current CMOS circuitry to provide some minimal on-board Read/Write memory.

In battery backup systems, the battery voltage is typically lower than the operating supply voltage. For example, the battery voltage may be approximately three volts, whereas the operating voltage is five volts. In order to prevent current from the power supply flowing into the battery and thus charging the battery, a PN diode is utilized that is reversed biased in the normal operating mode. This charging is undesirable in certain conditions such as where lithium batteries are utilized which can be damaged by charging. This diode is typically realized with a P-well formed in an N-type substrate, with the battery connected to the P-well for sourcing current to the N-type substrate when the operating supply voltage is not connected. The N-type substrate is then operable to be connected to the operating supply voltage when that is higher than the battery voltage. Thus, when the operating supply voltage is connected, the diode is reverse biased.

One problem that occurs in the diode protection system is the presence of a parasitic PNP transistor when the battery is sourcing current. This parasitic PNP transistor is formed by an adjacent P-well device in the N-type substrate that is connected to a voltage lower than the battery voltage, resulting in a reverse biased PN junction. Whenever the adjacent P-well device is connected to a voltage lower than the battery voltage and the external supply is not utilized, current can conduct through the substrate to the adjacent P-well device through this parasitic transistor. This is the result of minority carriers injected into the substrate from the forward biased PN junction of the battery protection diode and collected in the adjacent P-well. This leakage current therefore provides an unexpectedly high drain on the battery, thus reducing its lifetime and the lifetime of the battery backed-up product.

SUMMARY OF THE INVENTION

The present invention disclosed and claimed herein comprises a battery protection circuit for preventing battery charging. The battery charging circuit comprises a first PN junction formed near the surface of a substrate of a first conductivity type. The first PN junction is operable to have one side thereof coupled to a battery terminal for connection to a battery and the opposite side thereof for connection to a substrate through a conductor. The battery provides current to the substrate when the first PN junction is forward biased, and charging of the battery is prevented when the first PN junction is reverse biased. The substrate contains a second PN junction that is capable of being reverse biased and receiving minority carriers that are generated at the first PN junction when it is forward biased. An isolation layer is provided between the first and second PN junctions to inhibit injection of minority carriers into the substrate from the first PN junction when forward biased, which could be collected at the second PN junction in the absence of the isolating layer.

In another aspect of the present invention, the first PN junction is formed with a region of P-type material in the surface of the substrate that is totally enclosed (with the exception of the surface thereof) by a region of N-type material. A layer of material is then formed around and totally enclosing the N-type region (with the exception of the surface thereof) to prevent injection of minority carriers to the substrate from the first PN junction. The N-type region is electrically connected to the substrate through a conductor.

In yet another aspect of the present invention, the layer of material surrounding the N-type region comprises a region of P-type material that is biased to collect minority carriers. The biasing is accomplished by electrically connecting the P-type material to the N-type region.

BRIEF DESCRIPTION OF THE DRAWINGS

For a more complete understanding of the present invention and the advantages thereof, reference is now made to the following description taken in conjunction with the accompanying Drawings in which:

FIG. 1b illustrates a schematic diagram of the parasitic PNP transistor in the prior art structure of Figure 1a;

Figure 1A:
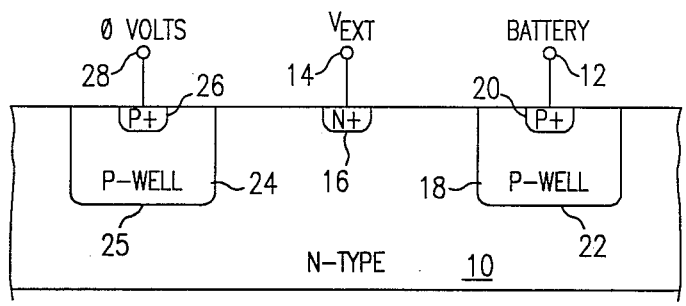
FIG. 1a illustrates a cross-sectional diagram of a prior art battery protection circuit.

It will be appreciated that for purposes of clarity and where deemed appropriate, reference numerals have been repeated in the figures to indicate corresponding features and that the cross-sectional diagrams have not necessarily been drawn to scale in order to more clearly show important features of the present invention.

DETAILED DESCRIPTION OF THE INVENTION

Referring now to FIG. 1a, there is illustrated a cross-sectional diagram of a semiconductor substrate 10 utilizing a prior art battery protection device. In this type of device, a battery terminal 12 is provided for being connected to a battery (not shown), and an external voltage terminal 14 is provided for being connected to an external supply voltage $V_{EXT}$. The battery terminal 12 is typically at a lower voltage than the external supply voltage $V_{EXT}$. For example, the battery voltage for most battery backup systems is typically around three volts, whereas the external voltage $V_{EXT}$ is typically around five volts.

The external supply terminal 14 is connected to the substrate 10, which is an N-type semiconductor substrate, through an n+ contact region 16. The battery terminal 12 is connected to a P-well 18 through a p+ contact region 20. The boundary of the P-well 18 forms a PN junction 22. Therefore, when the N-type substrate 10 is at a lower potential than the battery terminal 12, current will flow through the forward biased PN junction 22 from the battery terminal 12. However, when the external supply terminal 14 is a higher voltage than the battery terminal 12, the PN junction 22 is reversed biased and blocks current. This essentially prevents current flowing from the external terminal 14 to the battery terminal 12 and thus charging the battery.

In a typical CMOS semiconductor device utilizing P-wells and N-wells in a twin tub process, there will be additional P-wells that are separated from the P-well 18. One of these is represented by a P-well 24 which is disposed in the N-type substrate 10 and separated from the P-well 18 by a predetermined amount of the N-type substrate 10. A PN junction 25 is formed between the N-type substrate 10 and the P-well 24. The P-well 24 can be utilized to configure any type of device. In order to contact the P-well 24, a p+ contact 26 is provided which is connected to an external circuit terminal 28. It should be understood that the illustrated structure is merely representative of a portion of an active device that could be formed in the P-well 24.

A problem arises with the prior art device whenever the external voltage terminal is disconnected from $V_{EXT}$ and the external circuit terminal 28 is connected to a voltage lower than the battery terminal. This results in reverse biasing of PN junction 25. In this mode, minority carriers injected into the substrate 10 from the forward biased PN junction 22 can be collected at the PN junction 25. This results in the formation of a leaky parasitic PNP transistor. This parasitic PNP transistor is illustrated in FIG. 1b.

Figure 1B:
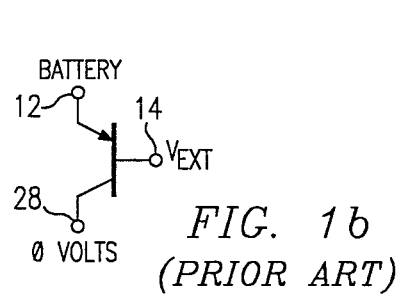

The parasitic transistor of FIG. 1b has the emitter junction formed between the P-well 18 and the N-type substrate 10 with the battery terminal 12 providing the emitter terminal. The base is formed by the N-type substrate 10 with the base terminal comprising the external voltage terminal 14. The collector junction is formed between the P-well 24 and the N-type substrate 10 with the external circuit terminal 28 representing the collector terminal. It can be seen that whenever the external voltage terminal 14 is disconnected, the parasitic transistor illustrated in FIG. 1b passes leakage current. This leakage current, in a relatively low power device, can comprise a significant portion of the supply current, since there are usually a number of adjacent P-wells on the substrate with a parasitic transistor connected to each of the adjacent P-wells. Since the bases of all of these transistors will be common, this effectively forms a multi-collector parasitic transistor.

Figure 2:
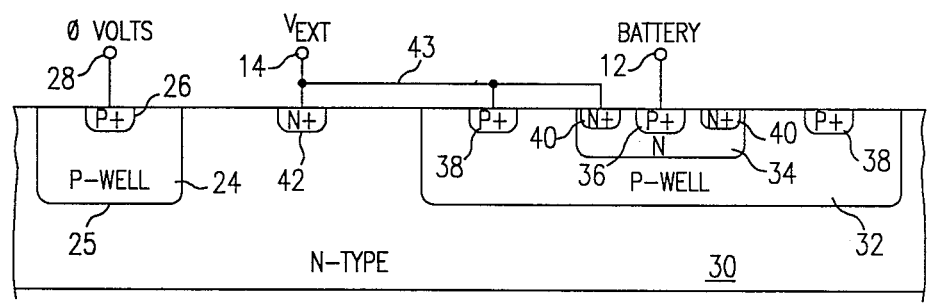
FIG. 2 illustrates a cross-sectional diagram of the battery protection circuit of the present invention.

Referring now to FIG. 2, there is illustrated a cross-sectional diagram of a preferred embodiment of the battery protection device of the present invention formed in an N-type substrate 30. A P-well 32 is formed in the N-type substrate 30, having a depth of approximately four microns. An N-type region 34 is formed in the P-well 32 to a depth of approximately 0.8 microns. A p+ region 36 is formed within the N-type region 34, the p+ region 36 having a thickness of approximately 0.40 microns. A p+ contact 38 is provided that surrounds or forms a ring around the N-type region 34 to provide a contact to the P-well 32. In a similar manner, an n+ contact 40 is provided that surrounds the p+ region 36 to provide contact from the surface to the N-type region 34. An n+ contact 42 is provided in the N-type substrate 30 outside the boundaries of the P-well 32. The external voltage terminal 14, having the voltage $V_{EXT}$ connected thereto, is interfaced with the n+ region 42. In a similar manner, the battery terminal 12 is interfaced with the p+ region 36. In addition, the external voltage terminal 14 is connected to the p+ region 38 and to the n+ region 40 through an interconnect line 43.

The P-well 24 and associated p+ region 26 and external circuit terminal 28 are also provided in the substrate 30 to illustrate the formation of the reverse biased PN junction 25. As will be described hereinbelow, the present invention prevents conduction from the battery terminal 12 to the PN junction 25 when the PN junction 25 is reverse biased. For illustrative purposes, the external circuit terminal 28 is connected to a voltage lower than the battery terminal, for example, zero volts.

Figure 3:
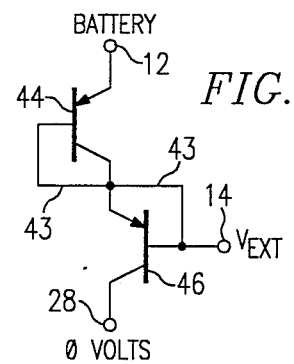
FIG. 3 illustrates an electrical schematic of the parasitic PNP transistors of the battery protection circuit of the present invention.

The parasitic transistors formed in the structure of FIG. 2 is illustrated in FIG. 3. A first PNP transistor 44 is formed having the emitter thereof connected to the battery terminal 12, the base thereof connected to the collector thereof and the collector thereof connected to the emitter of a second PNP transistor 46. The second PNP transistor 46 has the base thereof connected to the external supply terminal 14 and also connected to the emitter thereof. The collector of the second PNP transistor 46 is connected to the external circuit terminal 28. The transistor 44 has the emitter thereof formed by the junction between the p+ region 36 and the N-type region 34, the base thereof formed by the N-type region 34 and the collector thereof formed by the junction between the N-type region 34 and the P-well 32. The transistor 46 has the emitter thereof formed by the junction between the P-well 32 and the N-type region 30, the base thereof formed by the N-type region 30 and the collector thereof formed by the junction between the N-type region 30 and the P-well 24.

In operation, the P-type transistor 44 has the base thereof connected to the collector, and thus, it is configured as a diode. This allows current to flow through the collector of transistor 44 when the battery terminal 12 is at a higher voltage than the N-type substrate 30. However, the emitter-to-base junction of transistor 46 is shorted, thereby inhibiting operation of the transistor 46. Therefore, when the external voltage terminal 14 is at a lower voltage than the battery terminal 12, there is no parasitic transistor operation that results in leakage from the battery terminal 12 to the P-well 24.

Referring further to FIGS. 2 and 3, conduction in the parasitic transistor of the prior art normally occurs as a result of minority carriers being injected into the N-type substrate 30 and being collected in the P-well 24. This collection is a result of the reverse biased PN junction 25. In order to prevent conduction in the parasitic transistor, it is necessary to prevent either injection of the minority carriers into the N-type substrate 30, or prevent subsequent collection thereof by the P-well 24. This, in effect, kills the gain of the parasitic transistor.

In the present invention, the minority carriers exist in the N-type region 34 as holes. The P-well 32 is biased at the same potential as the N-region 34 and therefore acts as a collector for the minority carriers or holes. However, it should be understood that any barrier which prevents migration of minority carriers over to the PN junction 25 to allow collection there by the P-well 32 will produce the same result. For example, an insulating layer could be utilized that totally encloses the N-type region 34, which insulator would adequately prevent minority carrier injection. Further, the holes, which are collected in the P-well 32, could be recombined in a very heavily doped N-type region that was disposed around the N-region 34 in place of the P-well 32. This would effectively perform a recombination of the holes therein to prevent the holes from migrating into the N-type substrate 30. This heavily doped N-type region could also be disposed around the P-well 24.

With further reference to FIG. 2, the P-well 32 is provided as a collector of minority carriers. The purpose of the electrical connection 43 is to provide a path for free electrons or majority carriers. The holes generated in the N-type region 34 as a result of the forward biased PN junction between p+ region 36 and N-type region 34 are recombined at the junction between the electrical connection 43 and the n+ region 40, thus preventing the minority carriers from flowing through electrical connection 43 to the N-type substrate 30. It is possible that this electrical connection 43 could be replaced by a conductive n++ plug that is disposed through the P-well 32 to the N-type substrate 30 to connect the N-region 34 and the N-type substrate 30. However, an electrical connection would still be required between the P-well 32 and the N-type region 34 to provide the correct bias therefore.

Although the present invention was described with respect to an N-type substrate and parasitic PNP transistors, it should be understood that the dual of this structure could provide the same result wherein the battery voltage were a negative voltage and the overall system operated on a negative voltage. For example, the battery diode protection circuit would now have an n+ region connected to the battery and a P-type region providing the other side of the diode. An N-well would be disposed therearound isolating the diode from a P-type substrate. The N-well would provide the minority carrier isolation and act as a collector therefore, the minority carriers being electrons in this case. This would prevent minority carriers from being collected in an adjacent N-well to form a leaky NPN transistor.

Figure 4A:
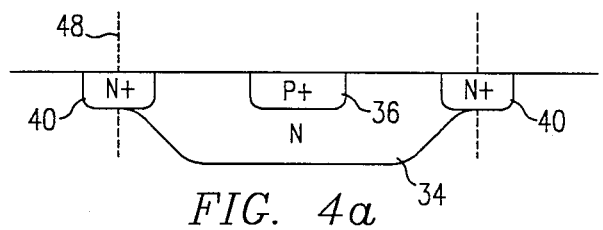
FIG. 4a illustrates a cross-sectional diagram of the portion of the diagram shown in FIG. 2.
Figure 4:
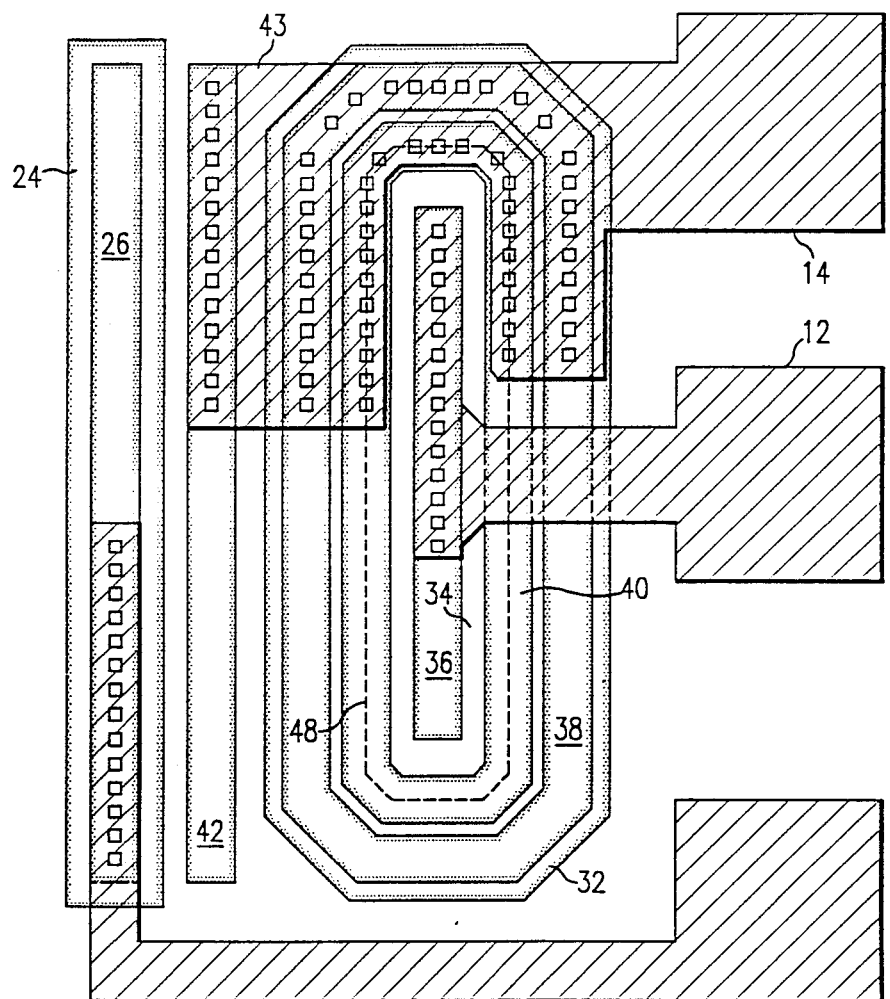
FIG. 4 illustrates a top view of the battery protection circuit of the present invention.

Referring now to FIG. 4, there is illustrated a top-level diagram of the structure of FIG. 2. The p+ region 36 is formed as an elongated implant that is surrounded by the n+ region 40. The n+ region 40 is in turn surrounded by the p+ region 38. The N-type region 34 to which the n+ region 40 is connected, does not extend entirely under the n+ region 40 to the exterior boundary thereof. Rather, the external boundary of the N-type region 34 is defined by a border 48. A detail of the N-type region 34 is illustrated in FIG. 4a. The P-well 32 is illustrated as surrounding the p+ region 38. The n+ region 42 is formed from an elongated implanted region that is disposed adjacent to the P-well 32. In a similar manner, the P-well 24 is also elongated and disposed adjacent the n+ region 42 with the p+ region 26 disposed within the P-well 24 and also having an elongated configuration.

The protection circuit of the present invention is interleaved with a standard twin tub CMOS process flow. In the standard process, N- and P-channel device regions are defined and then a P-well formed by implanting boron into the N-channel device region and an N-well formed by implanting phosphorous into the P-channel device region. These implants are then driven down into the substrate and then active regions defined therein and separated by a layer of field oxide. Typically, a layer of nitride is disposed over a thin oxide layer to define the active regions and then a field oxide grown on the portions of the substrate not having nitride formed thereover.

After formation of the field oxide isolation regions, the residual nitride layers are removed. There is still a layer of gate oxide over the active region remaining on the surface thereof. The surface is then masked for the implanting of the N-type region 34. This implant is achieved with phosphorous at an energy level of 180 KeV at a dosage of 5E13 ions/cm$^2$. After implanting of the N-type region 34, the residual oxide on the surface of the active region is removed and then a strip gate oxide is formed over the substrate. The active regions are then implanted to adjust the transistor threshold voltages.

After threshold voltages are adjusted, the strip gate oxide is removed and the final gate oxidation is performed, followed by polysilicon deposition and subsequent doping thereof. The poly is then patterned and etched to define the various gates and interconnects at a first level of poly. The N-channel source and drain areas are then defined to form the source/drain implants. This is an n+ implant utilizing arsenic, which implant is also utilized to form the n+ regions 40 and 42. The substrate is then masked to form the p+ source/drain implants, at which time the p+ regions 36, 38 and 26 are formed. Thereafter, the interlevel oxide is formed by depositing oxide thereover and this oxide is subjected to a thermal cycle to reflow the oxide and to provide the source/drain activation and drive steps. The subsequent contacts are then defined and etched and then a layer of metal deposited thereover. The metal layer is then patterned and etched to define the various metal interconnects.

Figure 5:
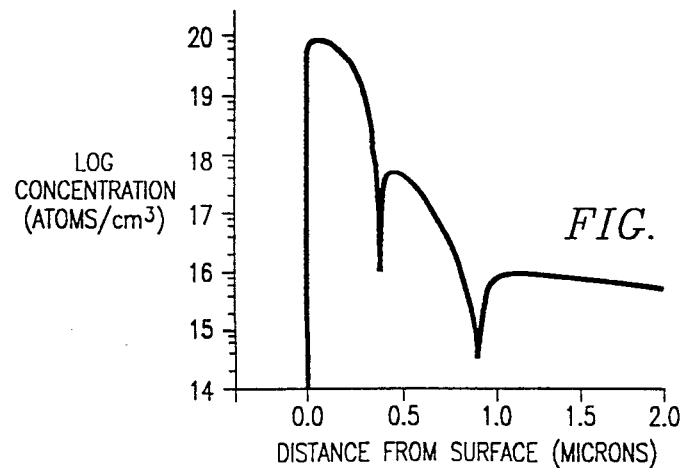
FIG. 5 illustrates a dopant profile of the battery protection circuit of the present invention.

Referring now to FIG. 5, there is illustrated a dopant profile for the cross-section 5—5 of FIG. 2. The dopant profile illustrates that the p+ region 36 has a surface concentration of approximately $1 \times 10^{20}$ ions/cm$^3$ and a thickness of approximately 0.35 microns. The N-type region 34 has a thickness of approximately 0.4 microns with a peak concentration of approximately $4 \times 10^{17}$ ions/cm$^3$. The concentration level of the P-well 32 is approximately $1 \times 10^{16}$ ions/cm$^3$. Therefore, the PNP transistor 44 formed by the p+ region 36, the N-type region 34 and the P-well region 32 has a base width of approximately 0.4 microns.

Figure 6:
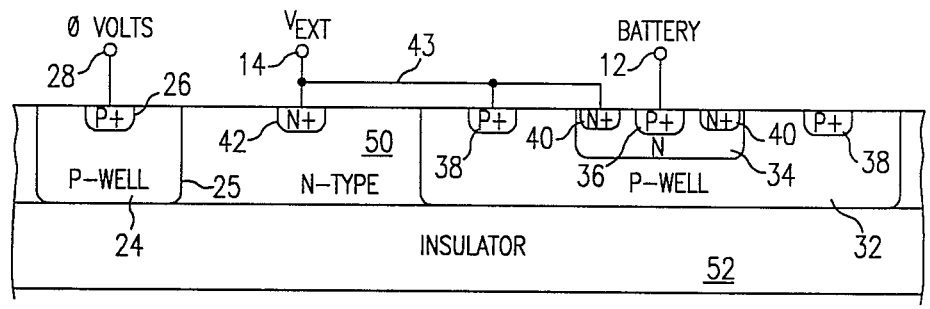
FIG. 6 illustrates a cross-sectional view of an alternate embodiment of the present invention utilizing a Silicon-On-Insulator construction.

Referring now to FIG. 6, there is illustrated an alternate embodiment of the present invention. In the alternate embodiment, the diode structure of the present invention is formed in an N-type substrate 50, which N-type substrate 50 is disposed over a layer of insulating material 52. This is normally referred to as Silicon-On-Insulator (SOI) technology. In this type of technology, an N-type substrate is first formed and then a layer of insulating material formed on the lower surface thereof. The N-type substrate 50 is typically dimensioned to equal the thickness of the P-well 32 and the P-well 24 such that no N-type material is disposed therebelow. In this manner, isolation between laterally disposed devices is increased.

There are numerous techniques for fabricating integrated circuits utilizing SOI technology. Some of these techniques require formation of the active device on the surface of an N-type substrate followed by deposition of a thick layer of oxide and polysilicon thereover. The substrate is then held from the upper side and the lower surface thereof etched down a predetermined distance. Typically, some type of heavily doped buried layer is implanted into the substrate to form an etch stop layer. The insulator is then formed on the remaining surface of the substrate under the active devices, the thick layer of polysilicon and oxide removed and the final patterning performed on the upper surface of the substrate. However, this is only one technique and numerous other techniques are available for realizing SOI technology.

Figure 7:
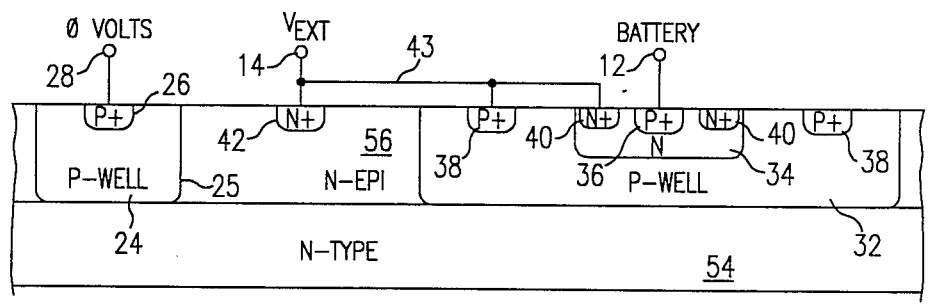
FIG. 7 illustrates a cross-sectional diagram of yet another embodiment of the present invention wherein the structure is fabricated in an epi-layer disposed on top of semiconductor material.

Referring now to FIG. 7 there is illustrated yet another embodiment of the present invention. An N-type substrate 54 is provided upon which a layer of epitaxially grown N-type semiconductor material 56 is grown. The P-well 24 and the P-well 32 are then formed therein with the N-type epi-layer 56 having a thickness approximately equal to that of the P-wells 24 and 32. The N-type substrate 54 has a higher doping level than the epi-layer 56, resulting in the parasitic transistors being confined primarily to the epi-layer 56. The epilayer 56 is formed utilizing conventional processes well-known in the art.

In summary, there has been provided a battery protection device that reduces leakage due to the existence of a parasitic PNP transistor between the battery terminal and an adjacent P-well. The battery protection device includes a diode that is enclosed by a layer of P-type material. The layer of P-type material is operable to collect minority carriers to prevent collection thereof by an adjacent P-well with a reverse biased PN junction.

Although the preferred embodiment has been described in detail, it should be understood that various changes, substitutions and alterations can be made therein without departing from the spirit and scope of the invention as defined by the appended claims.

What is claimed is:

1. A battery protection device for preventing battery charging, comprising:
   a semiconductor substrate predominantly having a first conductivity type;
   a first PN junction between a first region of said substrate, which has said first conductivity type, and a second region of said substrate which has a second conductivity type opposite to said first conductivity type
   a second PN junction between a third region of said substrate, which has said first conductivity type, and a fourth region of said substrate, which has said second conductivity type; and
   interface means, comprising an additional region of said substrate which is
      disposed between said first and second PN junctions, and
      ohmically connected to at least one of said first and second regions, and
      doped to defined a third PN junction and a fourth PN junction which are both interposed between said first junction and said second junction, to inhibit minority carrier injection from said first PN junction to said second PN junction when said first PN junction is forward biased and said second PN junction is reverse biased.

2. The battery protection device of claim 1, wherein said first PN junction is connected on one side to a battery terminal for being forward biased when a battery is providing current therethrough and for protecting the battery from being charged through the PN junction when the PN junction is reverse biased.

3. The battery protection device of claim 2, further comprising means for electrically connecting the other side of said first PN junction to said substrate.

4. The battery protection device of claim 3, wherein said interface means completely surrounds the other side of said first PN junction to separate said first PN junction from said substrate, said means for connecting being operable to provide an electrical connection between the other side of said first PN junction and said substrate.

5. The battery protection device of claim 3, wherein said minority carriers are holes and said interface means is operable to collect said hole 6. The battery protection device of claim 3, wherein said second region is connected to said battery terminal,
   and wherein said additional region of said interface means isolates said second region from the remainder of said substrate, and is operable to prevent minority carrier injection from said second region to said substrate,
   and wherein said means for connecting is operable to electrically connect said second region to said substrate.

7. The battery protection device circuit of claim 6, wherein said first conductivity type is N-type semiconductor material and said second conductivity type is P-type semiconductor material.

8. A battery protection device for preventing battery charging, comprising:
   a semiconductor substrate comprised of an N-type semiconductor material;
   a P-type region of P-type semiconductor material coupled to a battery terminal, the battery terminal being operable to be coupled to a battery;
   an N-type region of N-type semiconductor material disposed adjacent said region of P-type region and forming a first PN junction therewith;
   connection means for electrically coupling said N-type region to said N-type substrate;
   a second PN junction formed in said substrate and capable of being reverse biased; and
   interface means, comprising an additional region of said substrate which is disposed between said first and second PN junction, and ohmically connected to at least one of said first and second regions, and doped to define a third PN junction and a fourth PN junction which are both interposed between said first junction and said second junction, to prevent minority carrier injection from said first PN junction to said second PN junction when said first FN junction is forward biased and said second PN junction is reverse biased.

9. The battery protection circuit of claim 8, wherein said N-type region surrounds said P-type region such that only the surface of said P-type region is exposed for connection to said battery terminal.

10. The battery protection circuit of claim 8, wherein said interface means is operable to collect minority carriers.

11. The semiconductor substrate of claim 8, wherein said interface means immediately surrounds said N-type region.

12. The battery protection device of claim 8, wherein said additional region comprises a P-type well of P-type semiconductor material enclosing said N-type region, said P-type well being ohmically connected to said N-type region to provide collection of said minority carriers therein.

13. The battery protection device of claim 12, wherein said substrate has a layer of insulating material disposed on the lower surface thereof and said P-type well is proximate to the junction between said substrate and said insulating layer.

14. The battery protection device of claim 12, wherein said semiconductor substrate is comprised of two layers of N-type material of different doping concentrations with the uppermost layer having a lower concentration than th lowermost layer, and wherein said P-type well has the bottom surface thereof proximate to the junction between said two layers of N-type material.

15. A battery protection device for preventing battery charging, comprising:
an N-type substrate;
a first P-type region of P-type material on the surface of the substrate and having the upper surface thereof interfaced with a battery terminal for receiving an external battery voltage;
an N-type region of N-type semiconductor material enclosing the sides and lower surfaces of said P-type region to form a first PN junction, said N-type region having a portion thereof connected to the surface of said substrate;
a second P-type region of P-type semiconductor material disposed around said N-type region and having a portion thereof exposed on the surface of said substrate;
a second PN junction formed in the substrate and capable of being reverse biased;
means for ohmically connecting said first N-type region to said N-type substrate to allow current to flow therethrough, said means for connecting not allowing minority carriers to flow therethrough; and
means for biasing said second P-type region to collect minority carriers.

16. The battery protection circuit of claim 15, wherein said means for connecting comprises an electrical interconnection ohmically connected to the upper exposed portion of said N-type region and to said substrate, and said means for biasing comprises means for connecting the exposed upper portion of said second P-type region to the exposed portion of said N-type region.

17. A method for protecting a battery from battery charging, comprising:
providing a substrate, the substrate containing a first PN junction therein that is capable of being reverse biased;
disposing a second PN junction between the battery and the substrate;
connecting one end of a battery terminal to one side of the second PN junction such that the second PN junction is forward biased when supplying current therethrough to the substrate and the second PN junction operable to be reverse biased to prevent charging from the substrate;
preventing minority carriers from being injected into the substrate from the other side of the second PN junction when the second PN junction is forward biased and the first PN junction is reverse biased; and
ohmically connecting the other side of the second PN junction to the substrate in such a manner that minority carriers are not injected to the substrate from the second PN junction.

18. The method of claim 17, wherein the substrate comprises an N-type substrate and the step of disposing the second PN junction between the battery and the substrate comprises:
forming a region or P-type material on the surface of the substrate with an upper surface connected to the battery terminal;
forming a region of N-type material around the region of P-type material and enclosing the P-type material with the exception of the upper surface thereof.

19. The method of claim 18, wherein the step or preventing minority carriers from being injected into the substrate comprises disposing an isolating layer around the region of P-type material, the isolating layer preventing minority carriers from being injected thereacross into the substrate.

20. The method of claim 19, wherein the isolating layer is operable to collect minority carriers.

21. The method of claim 19, wherein the isolating layer comprises an isolating layer of P-type material that is biased to collect minority carriers.

22. The method of claim 21 wherein the step of connecting comprising disposing an electrical conductor between the region of N-type material and the substrate and connecting the isolating layer of P-type material through an electrical conductor to the N-type region.

23. The method of claim 21, and further comprising, forming a layer of insulating material on the lower surface of the substrate, and the P-type material of the isolating layer extending downward into the substrate and proximate the junction between the substrate and the insulating layer.

24. The method of claim 21, wherein the substrate is comprised of two layers of N-type material, the first layer having a lower concentration of N-type impurities than the second layer and wherein the isolating layer of P-type material has the lower surface thereof disposed adjacent the junction between the first and second layers.

25. A battery-backed CMOS integrated circuit, comprising:
a semiconductor body;

a plurality of NMOS and PMOS active devices, including at least some devices formed in P-well regions of said semiconductor body;

a first terminal, for receiving a positive voltage from a system power supply input;

a first N-type region of said semiconductor body, ohmically connected to said first terminal;

a first P-type region, comprising an additional one of said P-well regions, ohmically connected to said first terminal;

a second N-type region of said semiconductor body, ohmically connected to said first terminal, said first and second N-type regions being separated by said first P-type region;

a second P-type region within said second N-type region, said first and second P-type regions being separated by said second N-type region; and a second terminal, connected to said second P-type portion of said semiconductor body, for receiving a positive voltage from a battery.

26. The integrated circuit of claim 25, wherein said semiconductor body comprises an epitaxial layer on a semiconductor substrate.

27. The integrate circuit of claim 26 wherein said semiconductor body comprises an epitaxial layer on a semiconductor substrate.

28. The integrated circuit of claim 25, wherein said semiconductor body comprises a predominantly N-type epitaxial layer, which is substantially continuous with said first N-type region, on a semiconductor substrate.

29. The integrated circuit of claim 25 wherein said semiconductor body comprises a semiconducting layer on an insulating substrate.

30. The integrated circuit of claim 25 wherein said semiconductor body comprises an epitaxial layer on a semiconductor substrate, and wherein said first P-type region has a depth approximately equal to the depth of said epitaxial layer.

31. The integrated circuit of claim 25, wherein said semiconductor body comprises a predominantly N-type epitaxial layer, which is substantially continuous with said first N-type region, on a semiconductor substrate, and wherein said first P-type region has a depth approximately equal to the depth of said epitaxial layer.

32. An integrated circuit, comprising:

a semiconductor body;

a first terminal, for receiving a positive voltage from a system power supply input;

a first N-type region of said semiconductor body, ohmically connected to said first terminal;

a first P-type region of said semiconductor body, ohmically connected t first terminal;

a second N-type region of said semiconductor body, ohmically connected to said first terminal, said first and second N-type regions being separated by said first P-type region;

a second P-type region within said second N-type region, said first and second P-type regions being separated by said second N-type region; and a second terminal, connected to said second P-type portion of said semiconductor body, for receiving a positive voltage from a battery.

* * * * *